United States Patent
White et al.

(10) Patent No.: US 9,111,908 B2
(45) Date of Patent: Aug. 18, 2015

(54) SPLIT-GATE NON-VOLATILE MEMORY CELLS HAVING IMPROVED OVERLAP TOLERANCE

(75) Inventors: Ted R. White, Austin, TX (US); Gowrishankar L. Chindalore, Austin, TX (US); Brian A. Winstead, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 68 days.

(21) Appl. No.: 13/448,531

(22) Filed: Apr. 17, 2012

(65) Prior Publication Data

US 2012/0241839 A1    Sep. 27, 2012

Related U.S. Application Data

(62) Division of application No. 13/052,529, filed on Mar. 21, 2011, now Pat. No. 8,163,615.

(51) Int. Cl.
| | |
|---|---|
| H01L 29/76 | (2006.01) |
| H01L 29/423 | (2006.01) |
| H01L 21/28 | (2006.01) |
| H01L 27/115 | (2006.01) |
| H01L 29/788 | (2006.01) |

(52) U.S. Cl.
CPC .... *H01L 29/42332* (2013.01); *H01L 21/28273* (2013.01); *H01L 27/11524* (2013.01); *H01L 29/42328* (2013.01); *H01L 29/7881* (2013.01)

(58) Field of Classification Search
CPC ................................................ H01L 21/28273
See application file for complete search history.

(56) References Cited

U.S. PATENT DOCUMENTS

| | | | |
|---|---|---|---|
| 6,757,199 B2 * | 6/2004 | Tuan et al. | 365/185.33 |
| 6,816,414 B1 | 11/2004 | Prinz et al. | |
| 7,186,615 B2 | 3/2007 | Liu | |
| 7,456,465 B2 | 11/2008 | Prinz et al. | |
| 7,524,719 B2 | 4/2009 | Steimle et al. | |
| 7,579,243 B2 | 8/2009 | Kang et al. | |
| 7,767,522 B2 | 8/2010 | Toba et al. | |
| 8,143,663 B2 * | 3/2012 | Jeong | 257/315 |
| 2003/0034517 A1 * | 2/2003 | Chen | 257/315 |
| 2009/0042349 A1 | 2/2009 | Prinz et al. | |
| 2009/0256186 A1 * | 10/2009 | Kang et al. | 257/314 |

(Continued)

OTHER PUBLICATIONS

Pfiester, J.R., et al, "A TiN Strapped Polysilicon Gate Cobalt Salicide CMOS Process", IEEE, pp. 1-4, IEDM 90-241,1990.

(Continued)

*Primary Examiner* — Zandra Smith
*Assistant Examiner* — Andre' C Stevenson
(74) *Attorney, Agent, or Firm* — Sherry W. Schumm (57) ABSTRACT

Embodiments include a split-gate non-volatile memory cell that is formed having a control gate and a select gate, where at least a portion of the control gate is formed over the select gate. A charge storage layer is formed between the select gate and the control gate. The select gate is formed using a first conductive layer and a second conductive layer. The second conductive layer is formed over the first conductive layer and has a lower resistivity than the first conductive layer. In one embodiment, the first conductive layer is polysilicon and the second conductive layer is titanium nitride (TiN). In another embodiment, the second conductive layer may be a silicide or other conductive material, or combination of conductive materials having a lower resistivity than the first conductive layer.

11 Claims, 7 Drawing Sheets

(56) References Cited

U.S. PATENT DOCUMENTS

2010/0105199 A1* 4/2010 Yasui et al. ............ 438/593
2011/0207274 A1   8/2011 Kang et al.

OTHER PUBLICATIONS

McNelly, T.F., High performance 0.25 µm SRAM Technology with Tungsten Interpoly Plug, IEEE, pp. 1-4, IEDM 95-927, 1995.

* cited by examiner

SPLIT-GATE NON-VOLATILE MEMORY CELLS HAVING IMPROVED OVERLAP TOLERANCE

RELATED APPLICATION

This application is a Divisional of co-pending, U.S. patent application Ser. No. 13/052,529, filed on Mar. 21, 2011.

BACKGROUND

1. Field

This disclosure relates generally to integrated circuit memory, and more specifically, to a split-gate non-volatile memory cell having improved overlap tolerance and method therefor.

2. Related Art

A split-gate non-volatile memory cell includes a control gate and a select gate for controlling program, erase, and read operations. The control gate is used to control programming and erasing of the memory cell while the select gate is used to select when a memory cell is programmed or read. A prior art manufacturing process uses a three mask lithography process to form the two gates. Other processes may include the use of sacrificial features in addition to the three lithography processes. Alignment of each of the three masks is important. One prior art split-gate memory cell includes two polysilicon layers, where a portion of one polysilicon layer overlaps with a portion of the other layer. Any misalignment in the polysilicon layers can result in the control gate overlapping the select gate by too much overlap or too little. Too much overlap of the control gate over the select gate may minimize salicidation of the select gate causing failures due to high resistance of the select gate. Too little overlap, or no overlap, of the control gate over the select gate may cause poor isolation between the control gate and the select gate. The problem is worsened with scaling, resulting in reduced yields and decreased performance.

Therefore, what is needed is a split-gate memory cell, and a method for making a split-gate memory cell, that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a split-gate non-volatile memory cell that is formed having a control gate and a select gate, where at least a portion of the control gate is formed over the select gate. A charge storage layer is formed between the select gate and the control gate. The select gate is formed using a first conductive layer and a second conductive layer. The second conductive layer is formed over the first conductive layer and has a lower resistivity than the first conductive layer. In one embodiment, the first conductive layer is polysilicon and the second conductive layer is titanium nitride (TiN). In another embodiment, the second conductive layer may be a silicide or other conductive material, or combination of conductive materials having a lower resistivity than the first conductive layer.

By forming the second conductive layer to have a lower resistivity, a split-gate non-volatile memory cell can be formed that is more tolerant of overlap variations between the select gate and the control gate.

In one aspect, there is provided, a method for forming a split-gate non-volatile memory (NVM) cell including: forming a first gate layer over a semiconductor substrate; forming a conductive layer over the first gate layer; patterning the first gate layer and the conductive layer to form a first sidewall, wherein the first sidewall comprises a sidewall of the first gate layer and a sidewall of the conductive layer; forming a first dielectric layer over the conductive layer and the semiconductor substrate, wherein the first dielectric layer overlaps the first sidewall; forming a second gate layer over the first dielectric layer, wherein the second gate layer is formed over the conductive layer and the first gate layer and overlaps the first sidewall; and patterning the first gate layer and the second gate layer to form a first gate and a second gate, respectively, of the split-gate NVM cell, wherein the second gate overlaps the first gate and a portion of the conductive layer remains between the first gate and the second gate. A major surface of the portion of the conductive layer may be substantially parallel to a major surface of the substrate. The method may further include: forming a spacer adjacent sidewalls of the first gate and the second gate; forming source/drain regions in the substrate adjacent the first gate and adjacent the second gate; and forming silicide regions on an exposed surface of the second gate and on exposed surfaces of the source/drain regions. The step of forming silicide regions may further include forming a silicide region on an exposed surface of the first gate. The first gate may be further characterized as a select gate of the split-gate NVM cell and the second gate may be further characterized as a control gate of the split-gate NVM cell. The step of patterning the first gate layer and the second gate layer to form the first gate and the second gate may include: patterning the second gate layer to form a first sidewall of the second gate layer, wherein the patterning the second gate layer removes portions of the conductive layer over the first gate layer which are not covered by the second gate layer; and after the step of patterning the second gate layer to form the first sidewall of the second gate layer, patterning the second gate layer and first gate layer to form a second sidewall of the second gate layer and a second sidewall of the first gate layer. The step of patterning the first gate layer and the second gate layer to form the first gate and the second gate may include: using a single mask to pattern the first gate layer and the second gate layer to form first and second sidewalls of the second gate layer and a second sidewall of the first gate layer. The conductive layer may include a material having a resistivity of less than approximately 1000 milli-Ohms per square. The conductive layer may include a material selected from a group consisting of a transition metal and a compound of a transition metal. The conductive layer may include a material selected from a group consisting of a nitride, a silicide, and an oxide. The conductive layer may include titanium nitride.

In another aspect, there is provided, a method for forming a split-gate non-volatile memory (NVM) cell including: forming a select gate layer over a semiconductor substrate; forming a conductive layer over the select gate layer, wherein the conductive layer comprises a material selected from a group consisting of a nitride, a silicide, and an oxide; patterning the select gate layer and the conductive layer to form a first sidewall, wherein the first sidewall comprises a sidewall of the select gate layer and a sidewall of the conductive layer; forming a first dielectric layer over the conductive layer and the semiconductor substrate, wherein the first dielectric layer overlaps the first sidewall; forming a control gate layer over the first dielectric layer, wherein the control gate layer is formed over the conductive layer and the select gate layer and overlaps the first sidewall; patterning the select gate layer and the control gate layer to form a select gate and a control gate, respectively, of the split-gate NVM cell, wherein the control gate overlaps the select gate and a portion of the conductive layer remains between the select gate and the control gate; forming a spacer adjacent sidewalls of the first gate and the second gate; forming a first source/drain region in the substrate adjacent the select gate and a second source/drain region in the substrate adjacent the control gate; and forming silicide regions on an exposed surface of the control gate and on exposed surfaces of the first and second source/drain regions. The major surface of the portion of the conductive layer may be substantially parallel to a major surface of the substrate. The step of forming silicide regions may further include forming a silicide region on an exposed surface of the select gate. The step of patterning the select gate layer and the control gate layer to form the select gate and the control gate may include: patterning the control gate layer to form a first sidewall of the control gate layer, wherein the patterning the control gate layer removes portions of the conductive layer over the select gate layer which are not covered by the control gate layer; and after the step of patterning the control gate layer to form the first sidewall of the control gate layer, patterning the control gate layer and select gate layer to form a second sidewall of the control gate layer and a second sidewall of the select gate layer. The step of patterning the select gate layer and the control gate layer to form the select gate and the control gate may include: using a single mask to pattern the select gate layer and the control gate layer to form first and second sidewalls of the control gate layer and a second sidewall of the select gate layer. The conductive layer may include a material having a resistivity of less than approximately 1000 milli-Ohms per square.

In yet another aspect, there is provided, a split-gate non-volatile memory (NVM) cell, including: a first gate over a substrate; a conductive layer over the first gate; a dielectric layer over the conductive layer and the substrate, wherein the dielectric later overlaps a sidewall of the first gate; and a second gate over the dielectric layer, wherein the second gate overlaps the sidewall of the first gate such that a first portion of the second gate is over the first gate and a second portion of the second gate is not over the first gate, wherein the conductive layer is between the first portion of the second gate and the first gate. The conductive layer may have a resistivity of less than approximately 1000 milli-Ohms per square and may include a material selected from a group consisting of a nitride, a silicide, and an oxide. The split-gate NVM cell may further include: a first source/drain region in the substrate adjacent a second sidewall of the first gate; a second source/drain region in the substrate adjacent the second portion of the second gate; a first silicide on the first source/drain region; a second silicide on the second source/drain region; and a third silicide on the second gate.

The semiconductor substrate described herein can be any semiconductor material or combinations of materials, such as gallium arsenide, silicon germanium, silicon-on-insulator (SOI), silicon, monocrystalline silicon, the like, and combinations of the above.

As used herein the term metal-oxide-semiconductor and the abbreviation MOS are to be interpreted broadly, in particular, it should be understood that they are not limited merely to structures that use "metal" and "oxide" but may employ any type of conductor including "metal" and any type of dielectric including "oxide". The term field effect transistor is abbreviated as "FET".

FIG. 1 through FIG. 7 illustrate a method for forming a split-gate non-volatile memory cell in accordance with an embodiment. The method is characterized as including three masking steps.

Figure 1:
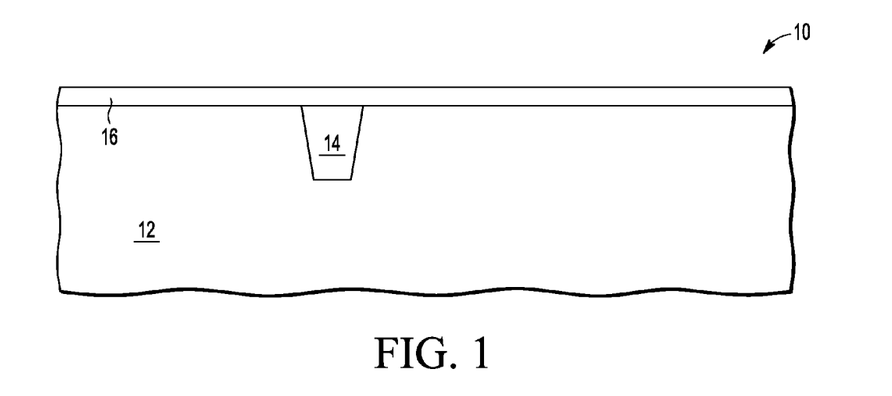
FIG. 1 through FIG. 7 illustrate a method for forming a split-gate non-volatile memory cell in accordance with an embodiment.

FIG. 1 illustrates a cross-section of a semiconductor device 10 at a stage in the method for forming. Semiconductor device 10 has a substrate 12. Shallow trench isolation (STI) 14 is formed in substrate 12 using a conventional STI process. Shallow trench isolation 14 is used to separate a logic device region from a memory cell region in substrate 12. In another embodiment, STI 14 may not be needed, or more than one STI 14 may be formed. A dielectric layer 16 is formed on substrate 12. The dielectric layer 16 may be any suitable gate dielectric. Gate dielectric layer 16 is either grown and/or deposited. In the illustrated embodiment, dielectric layer 16 is a conventional gate dielectric and comprises silicon dioxide. The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 2:
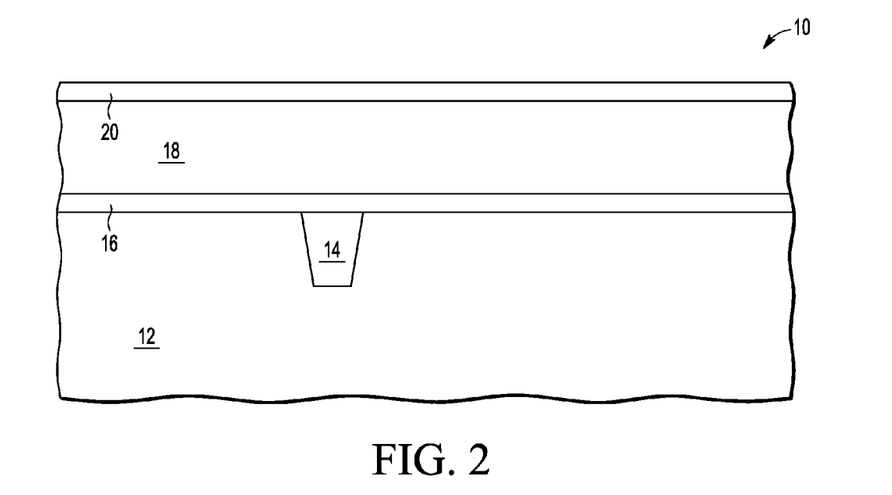

FIG. 2 illustrates a cross-section of semiconductor device 10 after a first conductive layer 18 is formed on dielectric layer 16. In one embodiment, first conductive layer 18 comprises polysilicon. Polysilicon layer 18 is deposited on gate dielectric layer 16 to a thickness of between 1000 and 2000 angstroms. In one embodiment, polysilicon layer 18 is 1500 angstroms thick. A second conductive layer 20 is formed on first conductive layer 18. Second conductive layer 20 may be a deposited metal, such as for example, a transition metal such as titanium or tungsten, or a compound of transition metals such as titanium nitride or a silicide. The deposited metals may be silicided with the polysilicon in one embodiment. The silicide temperatures may be between 400 and 800 degrees Celsius. The material used for conductive layer 20 should have properties that are not changed substantially in response to additional heating steps. For example, second conductive layer 20 may include transition metal nitrides, oxides, silicides, or the transition metal elements. In another embodiment, second conductive layer 20 may be a salicide formed by siliciding polysilicon layer 20. Also, in another embodiment, the first conductive layer 18 may be a different conductive material, such as a metal, and the second conductive layer 20 may be polysilicon, or another material having a higher resistivity than that of first conductive layer 18. In the illustrated embodiment, conductive layer 20 has a resistivity of less than approximately 1000 milli-Ohms per square.

Figure 3:
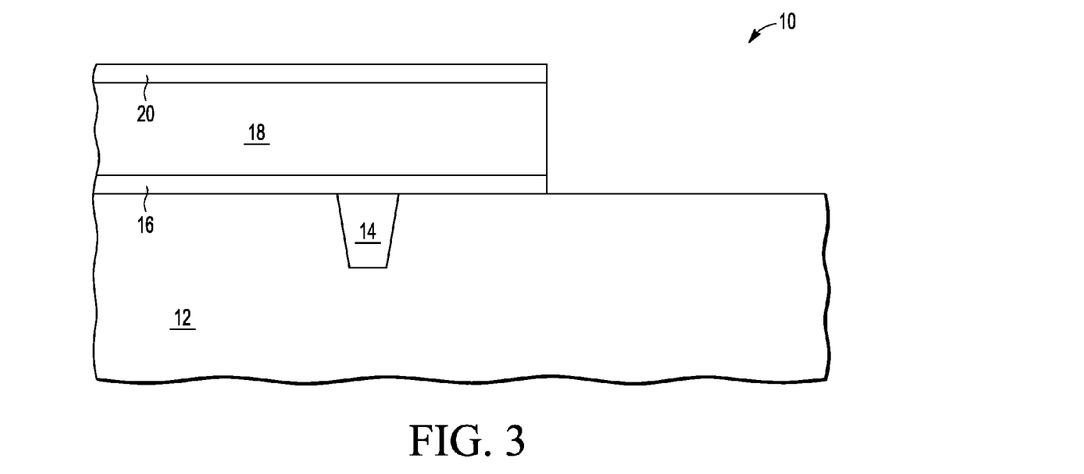

FIG. 3 illustrates a cross-section of semiconductor device 10 after a first conventional masking step is used to pattern polysilicon layer 18. Dielectric layer 16 is also removed from the area not covered by patterned polysilicon layer 18 using, for example, a wet etch. As can be seen in FIG. 3, the patterning results in polysilicon layer 18 having an edge with a sidewall.

Figure 4:
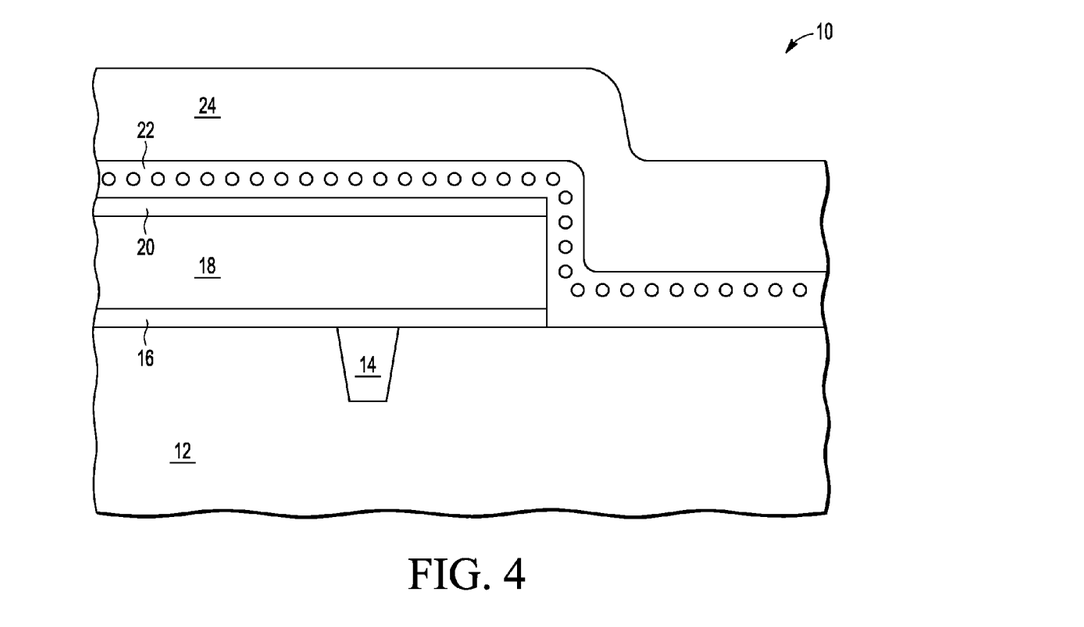

FIG. 4 illustrates a cross-section of semiconductor device 10 after a charge storage layer 22 is formed over conductive layer 20 and substrate 12. Charge storage layer 22 may include a plurality of nanocrystals for storing charge, as indicated by small circles in layer 22. The plurality of nanocrystals is isolated by an insulating material such as silicon dioxide. In one embodiment, charge storage layer 22 is formed in multiple layers (not shown), where a first dielectric layer is formed and nanocrystals are formed on the first dielectric layer. The nanocrystals may be formed from polysilicon, germanium, metal, or other suitable material. In another embodiment, nitride may be used to form charge storage regions in charge storage layer 22. A second dielectric layer is formed over the nanocrystals to isolate the nanocrystals from subsequently formed layers. In one embodiment, charge storage layer 22 is about 200 angstroms thick. In another embodiment, charge storage layer 22 may comprise nitride to store charge. Typically, the nitride charge storage layer is surrounded by other insulating layers such as oxide forming an oxide-nitride-oxide (ONO) structure. A third conductive layer 24 is formed over charge storage layer 22. In one embodiment, third conductive layer 24 may comprise polysilicon.

Figure 5:
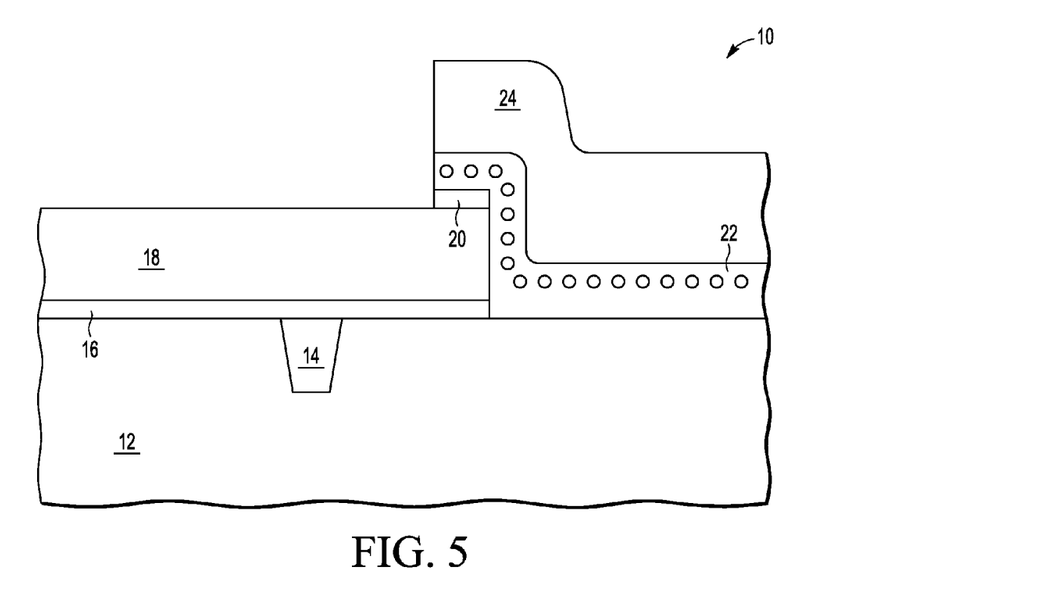

FIG. 5 illustrates a cross-section of semiconductor device 10 after a second masking step is used to pattern conductive layer 24 and conductive layer 20 to form a first edge, or sidewall, of a control gate for a split-gate non-volatile memory cell.

Figure 6:
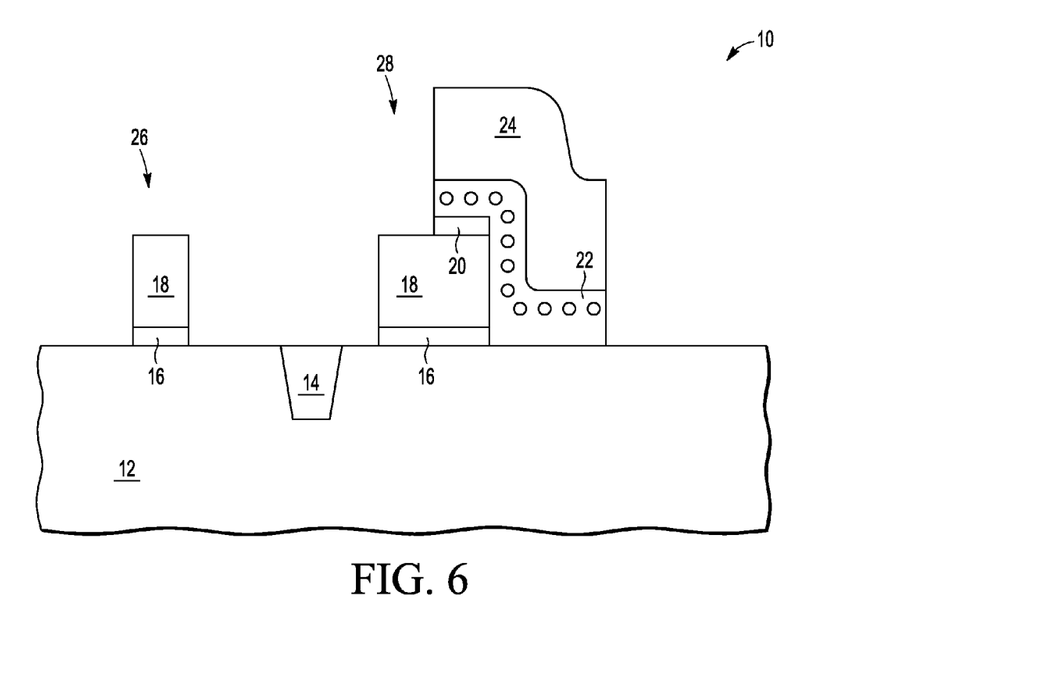

FIG. 6 illustrates a cross-section of semiconductor device 10 after a third masking step is used to pattern conductive layers 18 and 24, charge storage layer 22, and dielectric layer 16 to form a gate for a transistor 26, and a control gate and select gate for a memory cell 28. Transistor 26 is representative of a plurality of transistors that may be formed as part of semiconductor device 10. Likewise, memory cell 28 is representative of a plurality of memory cells that may be formed together on semiconductor device 10. Only one transistor 26 and one memory cell 28 are illustrated for purposes of simplicity and clarity. Conductive layer 18 is used to form a gate for transistor 26 and a select gate for memory cell 28. A control gate for memory cell 28 is formed using conductive layer 24. As can be seen in FIG. 6, conductive layer 24 overlaps a sidewall, or edge, of conductive layer 18 by a predetermined amount. In the area of overlap, a portion of conductive layer 20 remains between conductive layer 18 and conductive layer 24.

Figure 7:
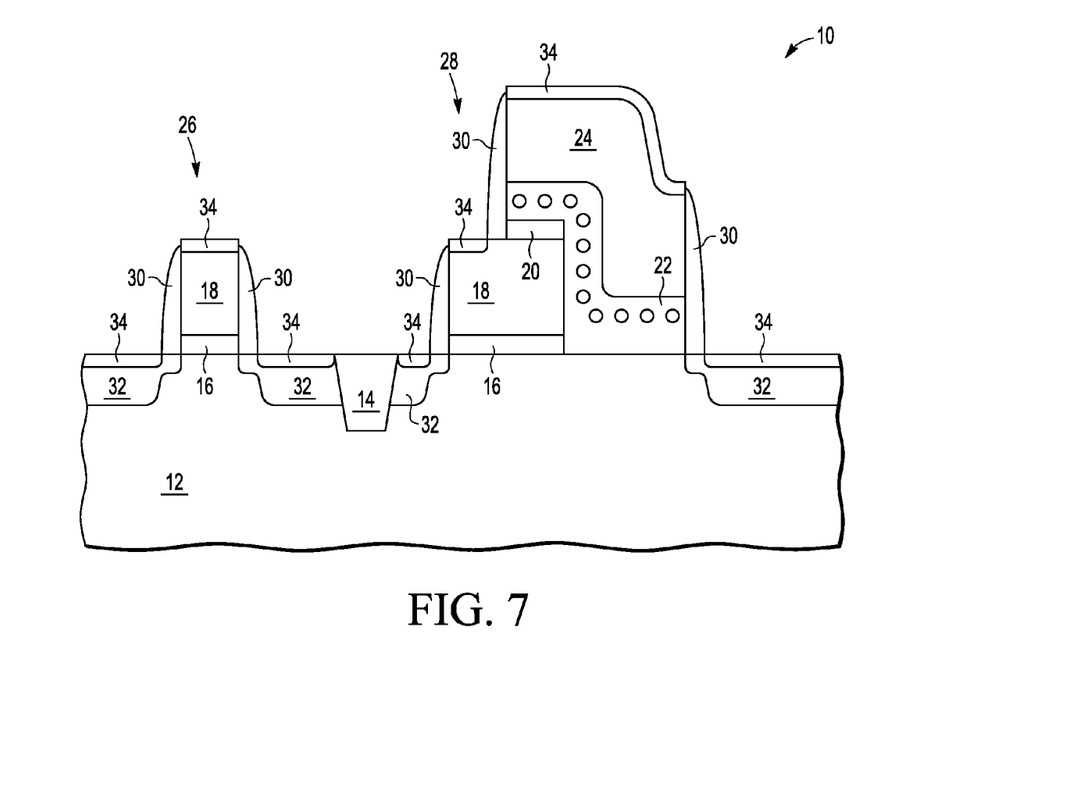

FIG. 7 illustrates a cross-section of semiconductor device 10 after further processing to complete formation of a split-gate memory cell. As illustrated in FIG. 7, source and drain extensions are formed in substrate 12 on the left side of the select gate (conductive layer 18) and on the right side of control gate (conductive layer 24) in memory cell 28. Also, source and drain extension are formed in substrate 12 on the left and right sides of the gate of transistor 26. Sidewall spacers 30 are formed adjacent the sides of polysilicon layer 18 and polysilicon layer 24. An insulating layer (not shown) may be formed between sidewall spacers 30 and polysilicon layers 18 and 24. Also, a sidewall spacer is formed on the left side of the control gate having polysilicon layer 24. Then a doping material is diffused into substrate 12 to create source/drain regions 32. The same doping material may be used to form both of the source and drain regions. The exposed portions of substrate 12 and polysilicon layers 18 and 24 are silicided to form salicide regions 34. Source, drain, select gate, and control gate contacts are then formed on salicide regions 34 (not shown) as well as additional interconnect and protection layers.

FIG. 8 through FIG. 13 illustrate a method for forming a split-gate non-volatile memory cell in accordance with another embodiment. The method is characterized as including two masking steps.

Figure 8:
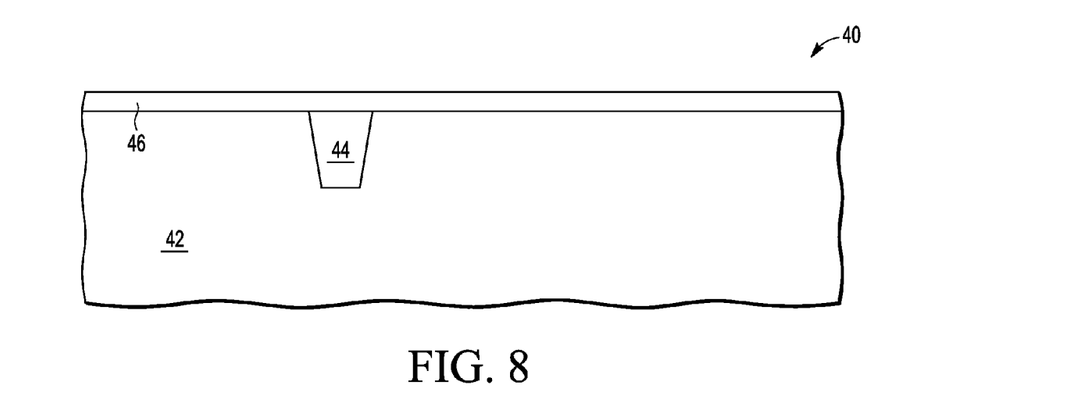
FIG. 8 through FIG. 13 illustrate a method for forming a split-gate non-volatile memory cell in accordance with another embodiment.

FIG. 8 illustrates a cross-section of a semiconductor device 40 at a stage in the method for forming. Semiconductor device 40 has a substrate 42. Shallow trench isolation (STI) 44 is formed in substrate 42 using a conventional STI process. Shallow trench isolation 44 is used to separate a logic device region from a memory cell region in substrate 42. In another embodiment, STI 44 may not be needed, or more than one STI 44 may be formed. A dielectric layer 46 is formed on substrate 42. The dielectric layer 46 may be any suitable gate dielectric. Gate dielectric layer 46 is either grown and/or deposited. In the illustrated embodiment, dielectric layer 46 is a conventional gate dielectric and comprises silicon dioxide. The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 9:
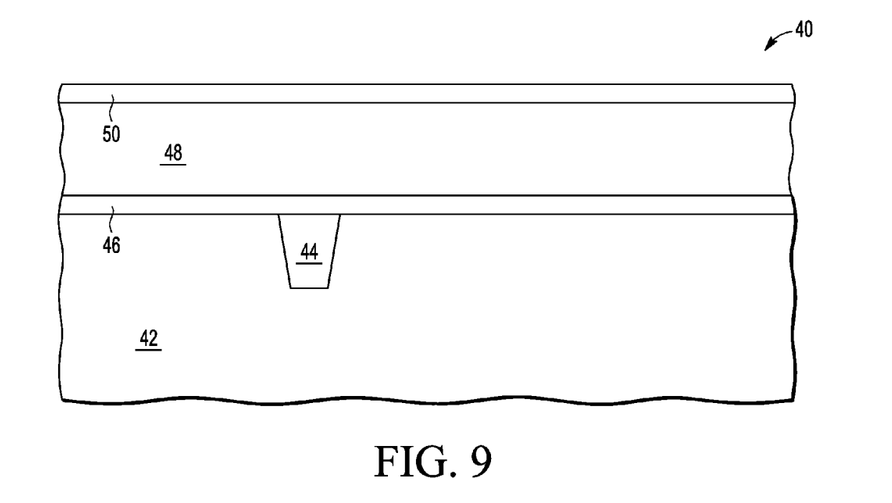

FIG. 9 illustrates a cross-section of semiconductor device 40 after a first conductive layer 48 is formed on dielectric layer 46. In one embodiment, first conductive layer 48 comprises polysilicon. Polysilicon layer 48 is deposited on gate dielectric layer 46 to a thickness of between 1000 and 2000 angstroms. In one embodiment, polysilicon layer 48 is 1500 angstroms thick. A second conductive layer 50 is formed on first conductive layer 48. Second conductive layer 50 may be a deposited metal, such as for example, a transition metal such as titanium or tungsten, or a compound of transition metals such as titanium nitride or a silicide. The deposited metals may be silicided with the polysilicon in one embodiment. The silicide temperatures may be between 400 and 800 degrees Celsius. In another embodiment, second conductive layer 50 may be a salicide formed by siliciding polysilicon layer 50. Also, in another embodiment, first conductive layer 48 may be a different conductive material, such as a metal, while the second conductive layer 50 may be polysilicon, or another material having a higher resistivity than first conductive layer 48. In the illustrated embodiment, conductive layer 50 has a resistivity of less than approximately 1000 milli-Ohms per square.

Figure 10:
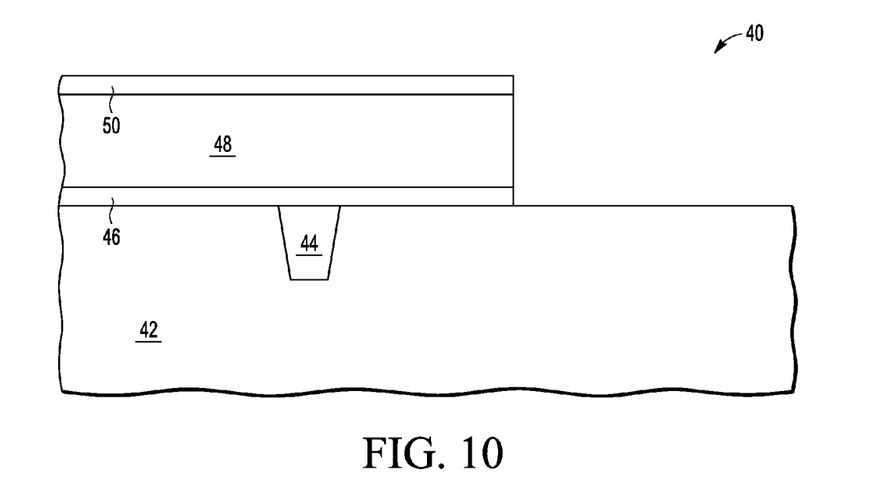

FIG. 10 illustrates a cross-section of semiconductor device 40 after a first conventional masking step is used to pattern polysilicon layer 48. Dielectric layer 46 is also removed from the area not covered by patterned polysilicon layer 48 using, for example, a wet etch. As can be seen in FIG. 10, the patterning results in polysilicon layer 48 having an edge with a sidewall.

Figure 11:
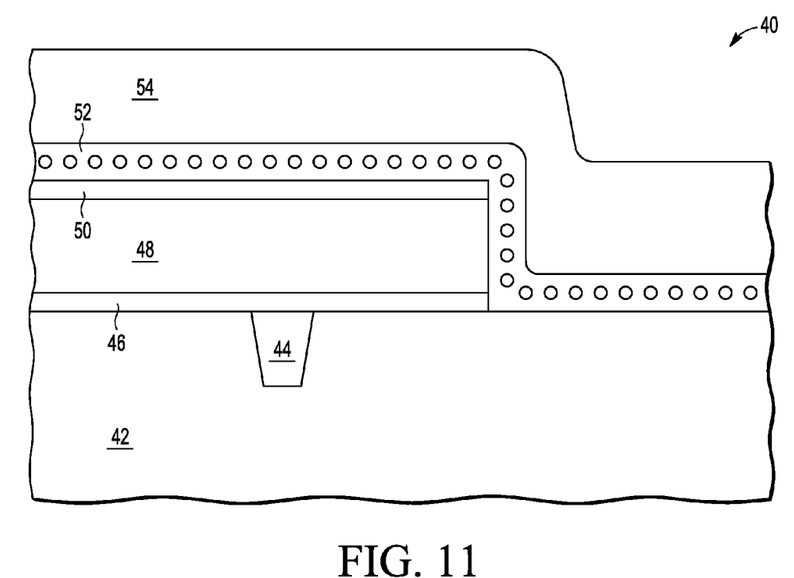

FIG. 11 illustrates a cross-section of semiconductor device 40 after a charge storage layer 52 is formed over conductive layer 50 and substrate 42. Charge storage layer 52 may include a plurality of nanocrystals for storing charge, as indicated by small circles in layer 52. The plurality of nanocrystals is isolated by an insulating material such as silicon dioxide. In one embodiment, charge storage layer 52 is formed in multiple layers (not shown), where a first dielectric layer is formed and nanocrystals are formed on the first dielectric layer. The nanocrystals may be formed from polysilicon, germanium, metal, or other suitable material. In another embodiment, nitride may be used to form charge storage regions in charge storage layer 52. A second dielectric layer is formed over the nanocrystals to isolate the nanocrystals from subsequently formed layers. In one embodiment, charge storage layer 52 is about 200 angstroms thick. In another embodiment, charge storage layer 52 may comprise nitride to store charge. Typically, the nitride charge storage layer is surrounded by other insulating layers such as an oxide forming an oxide-nitride-oxide (ONO) structure. Conductive layer 54 is formed over charge storage layer 52. In one embodiment, conductive layer 54 may comprise polysilicon.

Figure 12:
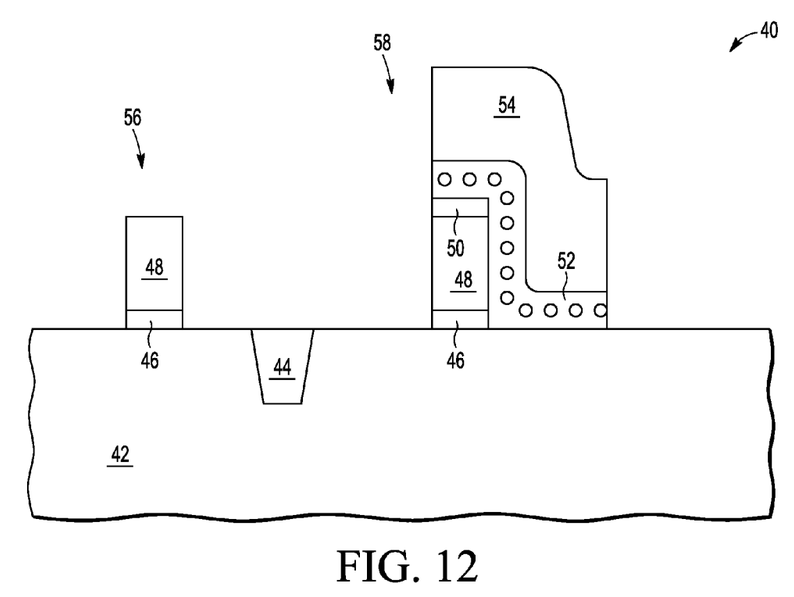

FIG. 12 illustrates a cross-section of semiconductor device 40 after a second masking step is used to pattern polysilicon layer 54, conductive layer 50, and conductive layer 48 forming transistor 56 and split-gate non-volatile memory cell 58. A control gate of memory cell 58 includes polysilicon layer 54 and the select gate of memory cell 58 includes conductive layers 48 and 50. Unlike semiconductor device 10, which is made with the above described 3 mask process, the 2 mask process results in a memory cell where the left edges, or sidewalls, of the control gate and select gate of memory cell 58 are aligned with each other.

Figure 13:
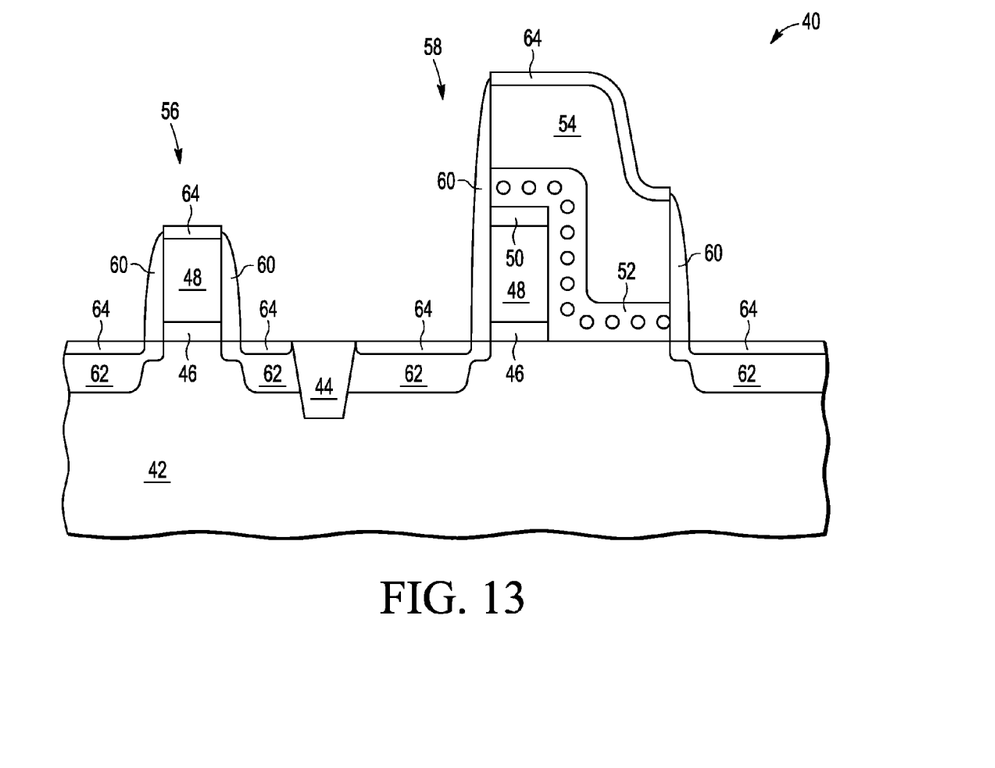

FIG. 13 illustrates a cross-section of semiconductor device 40 after further processing to complete formation of a split-gate memory cell. As illustrated in FIG. 13, source and drain extensions are formed in substrate 42 on the left side of the select gate and on the right side of control gate of memory cell 58, and on the left and right sides of transistor 56. Sidewall spacers 60 are formed on the sides of polysilicon layer 48 and polysilicon layer 54. An insulating layer (not shown) may be formed between sidewall spacers 30 and polysilicon layers 18 and 24. Also, a sidewall spacer is formed on the left side of the control gate having polysilicon layer 54. Then a doping material is diffused into substrate 42 to create source/drain regions 62. The same doping material may be used to form both the source and drain regions. The exposed portions of substrate 42 and polysilicon layers 48 and 54 are silicided to form salicide regions 64. Source, drain, select gate, and control gate contacts (not shown) are then formed on salicide regions 64 as well as additional interconnect and protection layers (not shown).

Using a select gate having two different conductive layers as described herein provides the advantage of a split-gate non-volatile memory cell that is more tolerant of overlap variations between the select gate and the control gate.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A split-gate non-volatile memory (NVM) cell, comprising:
   a first gate over a substrate, wherein the first gate is formed from a first conductive layer;
   a second conductive layer over the first gate;
   a dielectric charge storage layer over the second conductive layer and the substrate, wherein the dielectric later charge storage layer overlaps a first sidewall of the first gate; and
   a second gate over the dielectric charge storage layer, wherein the second gate is formed from a third conductive layer that overlaps the first sidewall of the first gate such that a first portion of the second gate is over the first gate and a second portion of the second gate is not over the first gate, wherein the conductive layer is between the first portion of the second gate and the first gate, the charge storage layer is between the first gate and the second gate, and wherein a second sidewall of the first gate and a sidewall of the second gate are aligned with each other in a vertical direction.

2. The split-gate NVM cell of claim 1, wherein the conductive layer has a resistivity of less than approximately 1000 milli-Ohms per square.

3. The split-gate NVM cell of claim 1, further comprising:
   a first source/drain region in the substrate adjacent the second sidewall of the first gate;
   a second source/drain region in the substrate adjacent the second portion of the second gate;
   a first silicide on the first source/drain region;
   a second silicide on the second source/drain region; and
   a third silicide on the second gate.

4. A split-gate non-volatile memory (NVM) cell comprising:
   a first gate layer on a semiconductor substrate;
   a conductive layer over the first gate layer, wherein the first gate layer and the conductive layer are patterned to form a first sidewall, wherein the first sidewall comprises a sidewall of the first gate layer and a sidewall of the conductive layer;
   a first dielectric charge storage layer over the conductive layer and the semiconductor substrate, wherein the first dielectric charge storage layer overlaps the first sidewall; and
   a second gate layer over the first dielectric charge storage layer, wherein the second gate layer is formed over the conductive layer and the first gate layer and overlaps the first sidewall, and wherein the first gate layer and the second gate layer are patterned to form a first gate and a second gate, respectively, of the split-gate NVM cell, wherein the second gate overlaps the first gate, a portion of the conductive layer remains between the first gate and the second gate, the charge storage layer is between the first gate and the second gate, and a second sidewall of the first gate layer and a sidewall of the second gate layer are aligned with each other in a vertical direction.

5. The split-gate NVM cell of claim 4, wherein a major surface of the portion of the conductive layer is substantially parallel to a major surface of the substrate.

6. The split-gate NVM cell of claim 4, further comprising:
   a spacer adjacent sidewalls of the first gate and the second gate;

source/drain regions in the substrate adjacent the first gate and adjacent the second gate; and silicide regions on an exposed surface of the second gate and on exposed surfaces of the source/drain regions.

7. The split-gate NVM cell of claim 4, wherein the first gate is further characterized as a select gate of the split-gate NVM cell and the second gate is further characterized as a control gate of the split-gate NVM cell.

8. The split-gate NVM cell of claim 4, wherein the conductive layer comprises a material having a resistivity of less than approximately 1000 milli-Ohms per square.

9. A split-gate non-volatile memory (NVM) cell comprising:
 a select gate layer over a semiconductor substrate;
 a conductive layer over the select gate layer, wherein the select gate layer and the conductive layer are patterned to form a first sidewall, and wherein the first sidewall comprises a first sidewall of the select gate layer and a first sidewall of the conductive layer;
 a charge storage layer over the conductive layer and the semiconductor substrate, wherein the first dielectric charge storage layer overlaps the first sidewall;
 a control gate layer over the first dielectric charge storage layer, wherein the control gate layer is formed over the conductive layer and the select gate layer and overlaps the first sidewall, and wherein the select gate layer and the control gate layer are patterned to form a select gate and a control gate, respectively, of the split-gate NVM cell, wherein the control gate overlaps the select gate, a portion of the conductive layer remains between the select gate and the control gate, the charge storage layer is between the select gate and the control gate, and a second sidewall of the control gate layer, a second sidewall of the conductive layer, and a sidewall of the second gate layer are vertically aligned with each other;
 a spacer adjacent the second sidewall of the control gate layer, the second sidewall of the conductive layer, and the sidewall of the control gate layer;
 a first source/drain region in the substrate adjacent the select gate and a second source/drain region in the substrate adjacent the control gate; and
 silicide regions on an exposed surface of the control gate and on exposed surfaces of the first and second source/drain regions.

10. The split-gate NVM cell of claim 9, wherein a major surface of the portion of the conductive layer is substantially parallel to a major surface of the substrate.

11. The split-gate NVM cell of claim 9, wherein the conductive layer comprises a material having a resistivity of less than approximately 1000 milli-Ohms per square.

* * * * *